United States Patent
Kim et al.

(10) Patent No.: US 10,312,682 B2
(45) Date of Patent: Jun. 4, 2019

(54) DEVICE AND METHOD FOR ASSESSING DYNAMIC STABILITY

(71) Applicant: LSIS CO., LTD., Anyang-si, Gyeonggi-do (KR)

(72) Inventors: Hong Joo Kim, Seoul (KR); Ae Kyoung Bae, Anyang-si (KR); Young In Kim, Seongnam-si (KR); Yoon Sung Cho, Gyeongsan-si (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 280 days.

(21) Appl. No.: 15/097,031

(22) Filed: Apr. 12, 2016

(65) Prior Publication Data
US 2016/0301206 A1    Oct. 13, 2016

(30) Foreign Application Priority Data

Apr. 13, 2015    (KR) .................. 10-2015-0052030

(51) Int. Cl.
| | | |
|---|---|---|
| *H02J 3/00* | (2006.01) | |
| *H02J 3/24* | (2006.01) | |
| *G05B 15/02* | (2006.01) | |
| *G06Q 50/06* | (2012.01) | |
| *G01R 21/133* | (2006.01) | |
| *G01R 19/25* | (2006.01) | |

(52) U.S. Cl.
CPC ............ *H02J 3/00* (2013.01); *G01R 19/2513* (2013.01); *G01R 21/133* (2013.01); *G05B 15/02* (2013.01); *G06Q 50/06* (2013.01); *H02J 3/24* (2013.01)

(58) Field of Classification Search
CPC .. G01R 19/2513; G01R 21/133; G05B 15/02; G06Q 50/06; H02J 3/00; H02J 3/24
See application file for complete search history.

(56) References Cited

U.S. PATENT DOCUMENTS

| | | | |
|---|---|---|---|
| 8,306,649 B2 | 11/2012 | Buzzoni et al. | |
| 2003/0200010 A1 | 10/2003 | Chiang et al. | |
| 2007/0005315 A1* | 1/2007 | Evans ................. | G06F 17/5036 703/2 |

(Continued)

FOREIGN PATENT DOCUMENTS

| | | |
|---|---|---|
| CN | 101413981 A | 4/2009 |
| CN | 104008512 A | 8/2014 |

(Continued)

OTHER PUBLICATIONS

European Patent Office Application Serial No. 16157637.6, Search Report dated Aug. 8, 2016, 6 pages.

(Continued)

*Primary Examiner* — Kenneth M Lo
*Assistant Examiner* — Chad G Erdman
(74) *Attorney, Agent, or Firm* — K&L Gates LLP

(57) ABSTRACT

A dynamic stability assessment device is provided. The dynamic stability assessment device includes an energy management system (EMS); and a dynamic stability assessment system for dynamic stability assessment on a power system of the energy management system. The EMS includes a plurality of facility names with respect to a single facility, and processes to power system data based on any one of the plurality of facility names according to a state of the power system.

10 Claims, 3 Drawing Sheets

(56) References Cited

U.S. PATENT DOCUMENTS

| | | | | |
|---|---|---|---|---|
| 2009/0063122 | A1* | 3/2009 | Nasle | G05B 23/0235 |
| | | | | 703/18 |
| 2010/0087959 | A1* | 4/2010 | Williams, Jr. | H02J 13/0079 |
| | | | | 700/286 |
| 2011/0282508 | A1* | 11/2011 | Goutard | H02J 3/06 |
| | | | | 700/293 |
| 2012/0213061 | A1* | 8/2012 | Chen | H04W 16/14 |
| | | | | 370/227 |
| 2012/0226920 | A1* | 9/2012 | Strumpf | G08C 15/02 |
| | | | | 713/300 |
| 2012/0277930 | A1* | 11/2012 | Ebata | H01L 31/02021 |
| | | | | 700/295 |
| 2013/0238154 | A1* | 9/2013 | Noureldin | G06F 17/5009 |
| | | | | 700/288 |
| 2014/0122051 | A1* | 5/2014 | Tobe | G06F 17/5009 |
| | | | | 703/18 |
| 2014/0129746 | A1 | 5/2014 | Zhou et al. | |
| 2014/0281645 | A1* | 9/2014 | Sen | G06Q 50/06 |
| | | | | 713/340 |
| 2015/0005970 | A1* | 1/2015 | Zweigle | H02J 3/24 |
| | | | | 700/295 |
| 2015/0066183 | A1 | 3/2015 | Nan et al. | |
| 2015/0105927 | A1* | 4/2015 | Baone | G05F 1/66 |
| | | | | 700/292 |
| 2015/0169730 | A1 | 6/2015 | Kim et al. | |
| 2016/0299187 | A1* | 10/2016 | Liang | H02H 1/0092 |
| 2016/0301206 | A1 | 10/2016 | Kim et al. | |
| 2017/0146574 | A1* | 5/2017 | Kuroda | G01R 19/2503 |

FOREIGN PATENT DOCUMENTS

| | | |
|---|---|---|
| CN | 104734345 A | 6/2015 |
| CN | 106056262 A | 10/2016 |
| EP | 2804361 | 11/2014 |
| EP | 2857994 | 4/2015 |
| JP | H07175515 | 7/1995 |
| JP | H10143235 | 5/1998 |
| JP | H1132433 | 2/1999 |
| JP | 2000-252179 | 9/2000 |
| JP | 2001-251763 | 9/2001 |
| JP | 2008-158879 | 7/2008 |
| JP | 2013-099065 | 5/2013 |
| JP | 2013-164825 | 8/2013 |
| KR | 10-0964298 | 6/2010 |
| KR | 1197576 | 11/2012 |
| KR | 1264645 | 5/2013 |
| KR | 2014-0082867 | 7/2014 |
| KR | 10-2014-0100165 | 8/2014 |

OTHER PUBLICATIONS

Korean Intellectual Property Office Application Serial No. 10-2015-0052030, Office Action dated Jun. 17, 2016, 5 pages.

Chinese Office Action for related Chinese Application No. 201610206768.3; action dated Dec. 14, 2018; (7 pages).

\* cited by examiner

_US 10,312,682 B2_

DEVICE AND METHOD FOR ASSESSING DYNAMIC STABILITY

CROSS-REFERENCE TO RELATED APPLICATIONS

Pursuant to 35 U.S.C. § 119(a), this application claims the benefit of earlier filing date and right of priority to Korean Patent Applications No. 10-2015-0052030 filed on Apr. 13, 2015, the contents of which are all hereby incorporated by reference herein in its entirety.

BACKGROUND

The present invention relates to a device and method for assessing dynamic stability, and more particularly, to a device and method for assessing dynamic stability that may assess the stability of a power system in real time.

The stability assessment device of a power system determines whether the power system currently operates stably. Since the instability of the power system may cause blackout, the stability assessment is one of elements that are important in terms of a power system operation.

Typical offline dynamic stability assessment programs all perform stability assessment based on a bus number. Powerflow data in a PTI RAWD format that is core data, to all data required for system analysis, such as dynamic data, contingency data and sequence data are linked with bus numbers based on which stability assessment is performed.

However, the bus number based stability assessment method has a limitation in that there is a need to reset all data and scenarios when the bus number is changed. Actually, the change of a topology, such as bus separation and integration frequently occurs in the power system, and a bus number and the number of buses vary each time the data is extracted. Thus, the method of assessing the stability of the power system based on the bus number has a difficulty in performing on various cases in real time.

Also, the bus number based stability assessment method may apply only a specific condition, such as generator dropping, when a specific bus has an accident, and it is difficult to apply a unspecific condition to the stability assessment. Especially, in the case where stability is assessed in real time, there is a limitation in that it is difficult to change a setting according to the unspecific condition each time a system topology varies.

SUMMARY

Embodiments provide a new dynamic stability assessment device and method.

Embodiments also provide a dynamic stability assessment device and method based on a facility name.

Embodiments also provide a facility name based dynamic stability assessment device and method with which an operation control scheme is combined.

In one embodiment, a dynamic stability assessment device includes an energy management system (EMS); and a dynamic stability assessment system for dynamic stability assessment on a power system of the energy management system. The EMS includes an EMS DB that stores power system data for energy management, a display unit configured to output a dynamic stability assessment result, and control unit configured to process the power system data stored in the EMS DB to power system data based on a facility name that includes an operation control scheme, to provide the processed power system data to the dynamic stability assessment system, and to enable an assessment result to be stored and output, the assessment result reflecting the operation control scheme that is received from the dynamic stability assessment system. The EMS includes a plurality of facility names with respect to a single facility, and is configured to process to power system data based on any one of the plurality of facility names according to a state of the power system.

In another embodiment, a dynamic stability assessment method includes providing, by an energy management system (EMS), power system data based on a facility name that includes an operation control scheme; reflecting, by the dynamic stability assessment system, the operation control scheme by using the power system data based on the facility name to reflect the operation control scheme to perform an dynamic stability assessment operation; providing, by the dynamic stability assessment system, an assessment result to the EMS; and storing and outputting, by the EMS, the assessment result, wherein the EMS includes a plurality of facility names with respect to a single facility, and is configured to process to power system data based on any one of the plurality of facility names according to a state of the power system.

DETAILED DESCRIPTION OF THE EMBODIMENTS

Figure 1:
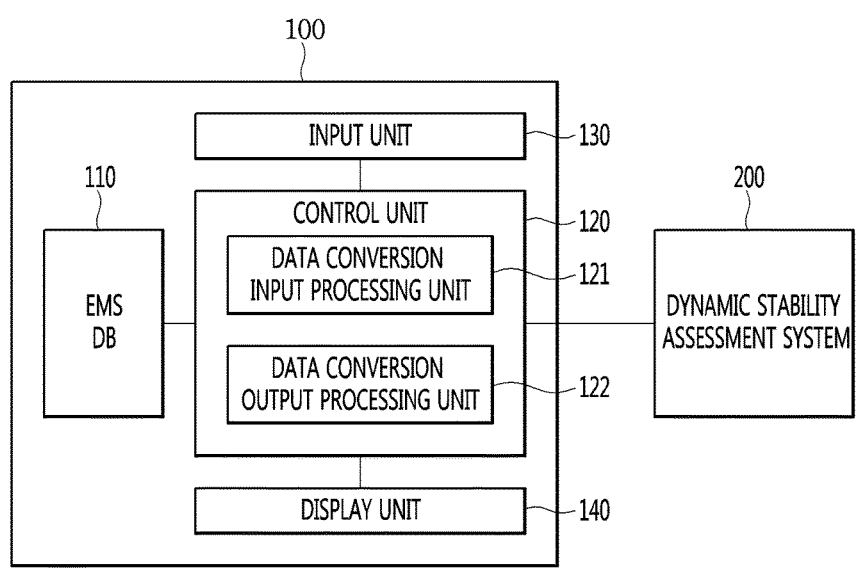
FIG. 1 is a block diagram for explaining a dynamic stability assessment device and method according to an embodiment.

Some embodiments are described below in more detail with reference to the accompanying drawings. Since the suffixes "module" and "unit" for components used in the following description are given and interchanged for easiness in making the present disclosure, they do not have distinct meanings or functions.

The effects and features of the inventive concept, and implementation methods thereof will be clarified through following embodiments below described in detail with reference to the accompanying drawings. An embodiment may, however, be embodied in different forms and should not be construed as limited to the embodiments set forth herein. Rather, these embodiments are provided to make this disclosure thorough and complete and fully convey the scope of an embodiment to a person skilled in the art. Further, the inventive concept is only defined by scopes of claims. Like reference numerals throughout the disclosure refer to like components.

When describing embodiments, detailed descriptions related to known functions or configurations will be ruled out in order not to unnecessarily obscure subject matters of the embodiments. In addition, since the terms used herein are defined in consideration of functions in the embodiments, they may vary depending on a user's or operator's intention or practice. Therefore, their definitions need to be made based on details throughout the present disclosure.

Combinations of each block of the accompanying drawing and combinations of each step of a flowchart may also be performed by computer program instructions. Since the computer program instructions may be loaded on the processor of a general-purpose computer, a special-purpose computer or other programmable data processing equipment, the instructions performed by the processor of the computer or other programmable data processing equipment create a means that performs functions described on each block of a drawing or each step of a flowchart. Since the computer program instructions may also be stored in a computer usable or computer readable memory that may aim at the computer or other programmable data processing equipment in order to implement functions in a specific manner, the instructions stored in the computer usable or computer readable memory may also produce an item that includes an instruction means performing functions described on each block of a drawing or each step of a flowchart. The computer program instructions may also be loaded on the computer or other programmable data processing equipment. Thus, since a series of operation steps are performed on the computer or other programmable data processing equipment to create processes executed by a computer, instructions operating the computer or other programmable data processing equipment may also provide steps for performing functions described on each block of a drawing and each step of a flowchart.

Also, each block or each step may represent a portion of a module, a segment or a code that includes one or more executable instructions for performing specific logical function(s). Also, it should be noted that some alternatives may be performed in such a way that functions mentioned at blocks or steps are performed in a different order. For example, two blocks or steps shown one after another may also be performed substantially at the same time or the blocks or steps may also be sometimes performed in a reverse order according to a corresponding function.

FIG. 1 is a block diagram for explaining a dynamic stability assessment device and method according to an embodiment.

Referring to FIG. 1, a dynamic stability assessment device according to an embodiment includes an energy management system 100 and a dynamic stability assessment system 200.

The energy management system 100 transmits data to the dynamic stability assessment system 200 and receives the data from the dynamic stability assessment system 200. The energy assessment system 100 provides, to the dynamic stability assessment system 200, power system data based on facility name with which an operation control scheme is combined, receives and stores an assessment result that is output from the dynamic stability assessment system 200.

For example, the energy management system 100 may also include, tidal current calculation data, dynamic data, a facility name table, a node-bus mapping table, a contingency group, interface data, fault cascading protection data and so on, as power system data obtained for energy management.

The dynamic stability assessment system 200 may include, power transmission data, monitoring data, prevention modification control data, scenario definition data, calculation parameter data, governor response data, tap-switchover transformer control data, load conversion data, frequency mode analysis data, and so on, as data that a user may input or modify. The dynamic stability assessment system 200 may roughly include transient stability assessment (TSA), voltage stability assessment (VSA), and small-signal stability assessment (SSA) according to a factor that determines system stability.

In order for the dynamic stability assessment system 200 to use power system data from the energy management system 100 to assess dynamic stability, a data link program is required between the energy management system 100 and the dynamic stability assessment system 200. The data linkage program may be a real-time data link program that is described below.

The energy management system 100 may include an energy management system (DMA) DB 110, a control unit 120, an input unit 130, and a display unit 140.

A command or data for the operation of the energy management system 100 may be input to the input unit 130.

The EMS DB 110 is a DB for calculating and storing the power system data for energy management.

The control unit 120 includes a data conversion-input processing unit 121 and a data conversion-output processing unit 122. The data conversion-input processing unit 121 and the data conversion-output processing unit 122 may use the real-time data link program to transmit and receive data to and from the dynamic stability assessment system 200. The data conversion-input processing unit 121 uses the real-time data link program to transmit power system data to the dynamic stability assessment system 200 based on a facility name that includes an operation control method. The data conversion-output processing unit 122 receives assessment data output from the dynamic stability assessment system 200 to store the received assessment data in the EMS DB 110.

The display unit 140 displays the assessment result from the dynamic stability assessment system 200.

The real-time data link program uses a PTI RAWD data format and furthermore, uses a data format which a unique 65-bit facility name is inserted into the last column for each facility. For the unique facility name, a facility name may include a facility type, an equipment name and a node name. For the operation control method, the facility name includes ACT, an operation facility name, and an operation control mode.

For e.g., a specific power transmission line, the facility name of a transmission line may have LN as the facility type, new Ansung PO SSS1 as the equipment name and node name of a first point, and new Seosan PO SAS1 as the equipment name and node name of a second point, and furthermore it is possible to include ACT GN Taean TP GN1 TRIP as the operation control scheme that drops Taean generator #1 when the power transmission line has a fault. Thus, the facility name of the power transmission line may be LN new Ansung PO SSS1 new Seosan PO SAS1_ACT GN Taean TP GN1 TRIP.

For e.g., a specific power transmission line, the facility name of a transmission line may have LN as the facility type, new Ansung PO SSS1 as the equipment name and node name of a first point, and new Seosan PO SAS1 as the equipment name and node name of a second point, and furthermore it is possible to include ACT SH Asan PO C5S INSERT as the operation control scheme that adds the shunt of Asan PO. Thus, the facility name of the power transmission line may be LN new Ansung PO SSS1 new Seosan PO SAS1_ACT SH Asan PO C5S INSERT.

As such, the real-time data link program in the present disclosure uses a unique facility name that includes a facility type, an equipment name, a node name, and an operation control method.

If the power system data on the specific power transmission line is provided to the dynamic stability assessment system 200 based on the facility name of the power transmission line, the dynamic stability assessment system 200 performs dynamic stability assessment after dropping the Taean generator #1 when the power transmission line has a fault or inserting the shunt of the Asan PO according to the operation control scheme.

Since in the embodiment, power system data is produced by using a unique facility name, a facility name does not vary even when the topology of a power system varies such that the resetting of the power system data is unnecessary.

Also, since in the embodiment, a facility including an operation control scheme is used, the dynamic stability assessment system 200 may reflect the operation control scheme of the facility name to perform dynamic stability assessment even when the dynamic stability assessment system 200 is not separately set, and it is possible to assess dynamic stability in real time even when the topology of the power system varies.

In the embodiment, the control unit 120 of the energy management system 100 may generate a plurality of facility names with respect to a single facility according to the control of a user, as in the facility name of the power transmission line as described earlier. That is, it is possible to create a plurality of facility names that has the same facility type, equipment name, and node name but reflects a plurality of operation control methods. For example, a user may create five facility names that reflect five operation control methods, with respect to a single facility.

In addition, a user may set an operation control scheme according to a specific operating condition or managing condition of a power system with the energy management system 100.

In this case, the control unit 120 of the energy management system 100 provides, to the dynamic stability assessment system 200, power system data based on the facility name that reflects the operation control scheme according to the operating condition or managing condition of the current power system.

The dynamic stability assessment system 200 reflects the operation control scheme included in the facility name to perform dynamic stability assessment.

Thus, the dynamic stability assessment system 200 may perform dynamic stability assessment in real time even when the topology of the power system varies.

Figure 2:
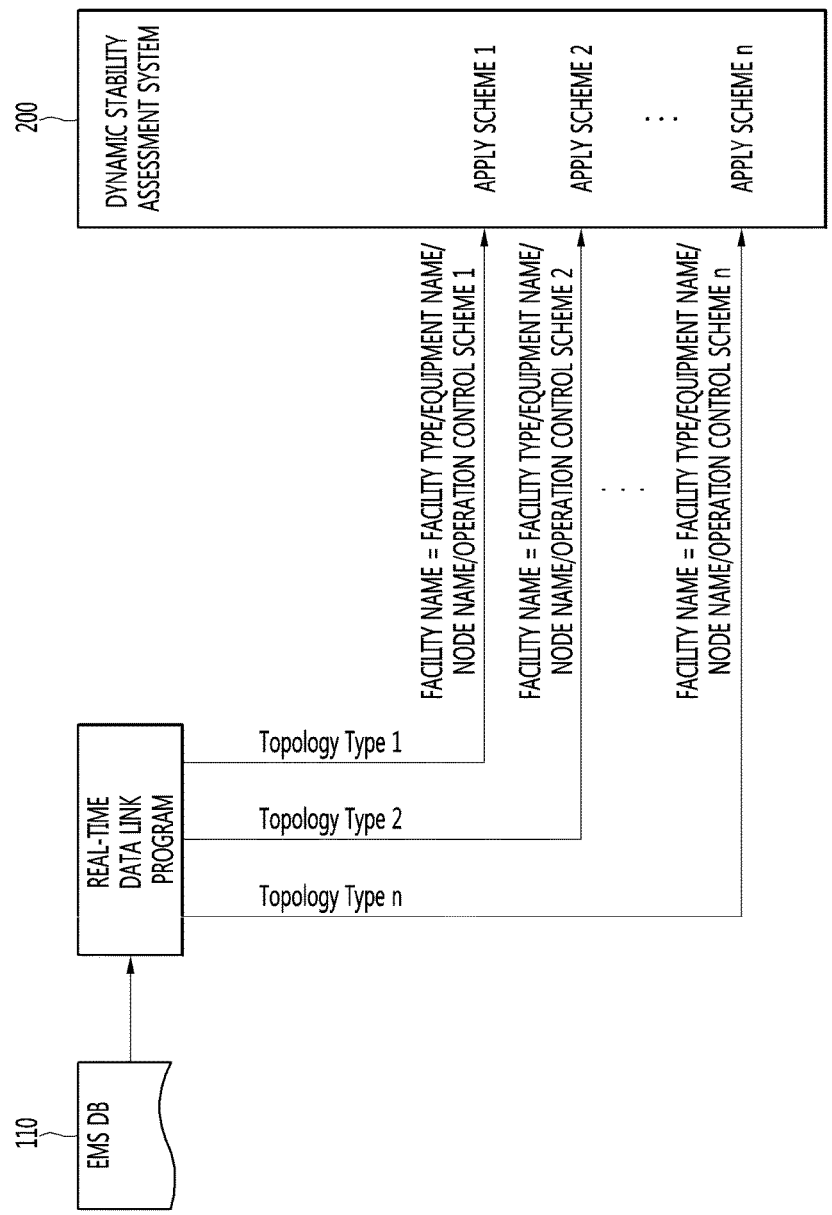
FIG. 2 illustrates the case where a plurality of facility names is used in a dynamic stability assessment system according to an embodiment.

FIG. 2 illustrates the case where a plurality of facility names is used in a dynamic stability assessment system according to an embodiment.

As shown in FIG. 2, a real-time data link program may set n operation control methods with respect to a single facility according to a topology type and applies an appropriate operation control scheme according to a selected topology type to perform dynamic stability assessment.

For example, topology type 1, topology type 2, and topology type n are set with respect to a single facility in FIG. 2, and in the case where the topology type 2 is selected, scheme 2 is applied to perform dynamic stability assessment.

Figure 3:
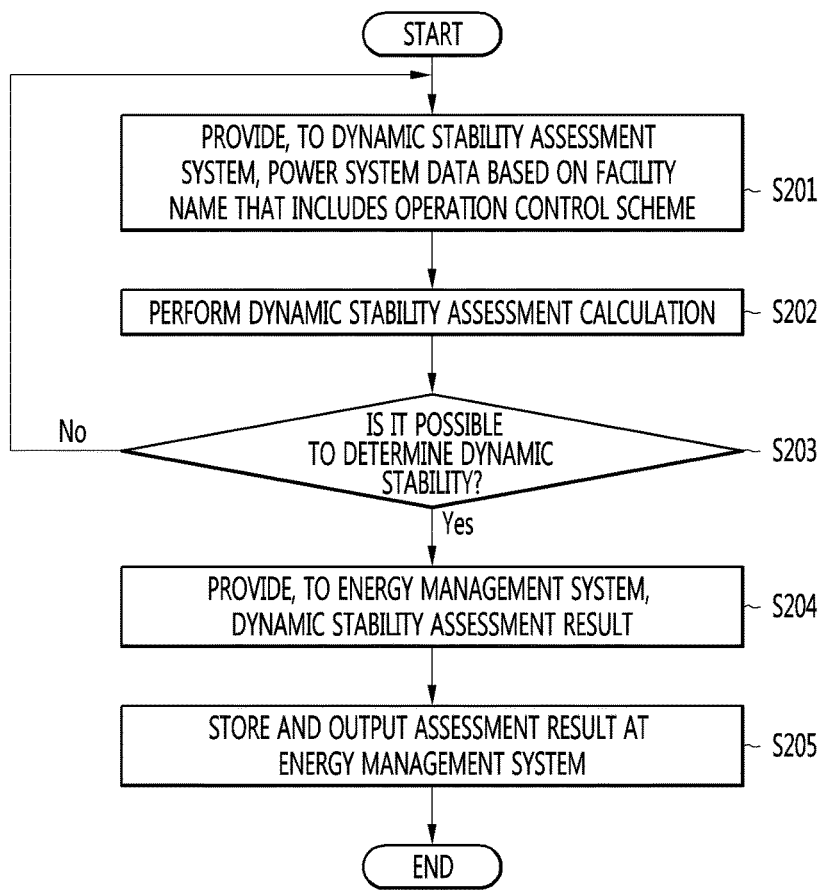
FIG. 3 is a flowchart for explaining a dynamic stability assessment method according to an embodiment.

FIG. 3 is a flowchart for explaining a dynamic stability assessment method according to an embodiment.

Referring to FIG. 3, the control unit 120 of the energy management system 100 receives power system data for real-time dynamic stability assessment and provides, to the dynamic stability assessment system 200, power system data based on facility name that includes an operation control scheme, in step S201.

The dynamic stability assessment system 200 reflects the operation control scheme to perform dynamic stability assessment calculation in step S202. The dynamic stability assessment calculation may be based on at least one or more scenarios that are pre-stored. In addition, the dynamic stability assessment calculation may be performed through power system data based on a unique facility name that is irrelevant to whether the topology of a power system varies.

When it is possible for the dynamic stability assessment system 200 to determine dynamic stability through input data in step S203, the dynamic stability assessment system 200 performs dynamic stability assessment calculation to provide an assessment result to the energy management system 100 in step S204. If it is difficult to determine dynamic stability, further power system data is received from the control unit 120.

The energy management system 100 stores and outputs the provided assessment result so that the assessment result is displayed on the display unit 140, in step S205.

Embodiments may provide a new dynamic stability assessment device and method.

Embodiments may also provide a dynamic stability assessment device and method based on a facility name.

Embodiments may also provide a dynamic stability assessment device and method based on a facility name with which an operation control scheme is combined.

The above-described embodiments are not limited to the above-described configuration and method, and some or all of the embodiments may also be selectively combined so that various variations may be implemented.

Also, although exemplary embodiments have been illustrated and described above, the inventive concept is not limited to specific embodiments described above but may be varied by a person skilled in the art without departing from the subject matter of the inventive concept claimed in the following claims and the variations should not be understood separately from the technical spirit or perspective of the inventive concept.

What is claimed is:

1. A dynamic stability assessment device comprising:
   an energy management system (EMS); and
   a dynamic stability assessment system for dynamic stability assessment on a power system of the energy management system,
   wherein the EMS comprises:
      an EMS DB that stores power system data for energy management,
      a display unit configured to output a dynamic stability assessment result, and
      a control unit configured to process the power system data stored in the EMS DB and to provide the processed power system data to the dynamic stability assessment system,
   wherein the dynamic stability assessment system is configured to perform the dynamic stability assessment through the processed power system data,
   wherein the control unit is further configured to generate a plurality of facility names with respect to a single facility and process the power system data based on a facility name among the plurality of facility names according to an operating condition of a current status of the power system,
   wherein each of the plurality of facility names comprises a facility type, an equipment name, a node name, and an operation control scheme, and
   wherein each of the facility type, the equipment name, and the node name of each of the plurality of facility names with respect to the single facility are the same among the plurality of facility names, and the operation control scheme of each of the plurality of facility names with respect to the single facility is different from each other among the plurality of facility names.

2. The dynamic stability assessment device according to claim 1, wherein a real-time data link program is used for data transmission and reception between the EMS and the dynamic stability assessment system.

3. The dynamic stability assessment device according to claim 2, wherein the real-time data link program uses a data format into which the plurality of facility names are inserted, for each facility.

4. The dynamic stability assessment device according to claim 1, wherein an operation facility name, and an operation control mode are added as an operation name for the operation control scheme.

5. The dynamic stability assessment device according to claim 1, wherein the dynamic stability assessment system performs dynamic stability assessment after an action according to the operation control scheme is taken.

6. A dynamic stability assessment method comprising:
providing, by an energy management system (EMS), power system data;
reflecting, by the dynamic stability assessment system, an operation control scheme by using the power system data provided from the EMS to perform a dynamic stability assessment operation;
providing, by the dynamic stability assessment system, an assessment result to the EMS;
outputting, by the EMS, the assessment result;
generating, by the EMS, a plurality of facility names with respect to a single facility; and
processing, by the EMS, the power system data based on a facility name among the plurality of facility names according to an operating condition of a current power system,
wherein each of the plurality of the facility names comprises a facility type, an equipment name, a node name, and the operation control scheme, and
wherein each of the facility type, the equipment name, and the node name of each of the plurality of facility names with respect to the single facility are the same among the plurality of facility names, and the operation control scheme of each of the plurality of facility names with respect to the single facility is different from each other among the plurality of facility names.

7. The dynamic stability assessment method according to claim 6, wherein the dynamic stability assessment operation is performed based on at least one pre-stored scenario.

8. The dynamic stability assessment method according to claim 6, further comprising receiving further power system data from the EMS, when it is difficult for the dynamic stability assessment system to determine dynamic stability.

9. The dynamic stability assessment method according to claim 6, wherein a real-time data link program is used for data transmission and reception between the EMS and the dynamic stability assessment system.

10. The dynamic stability assessment method according to claim 9, wherein the real-time data link program uses a data format into which the plurality of facility names are inserted for each facility.

\* \* \* \* \*